United States Patent [19]

Hodgins et al.

[11] Patent Number: 4,594,862
[45] Date of Patent: Jun. 17, 1986

[54] HEAT TRANSFER ARRANGEMENT

[75] Inventors: Diana M. Hodgins; George J. R. Homewood, both of Stevenage, England

[73] Assignee: British Aerospace Public Limited Company, London, England

[21] Appl. No.: 689,015

[22] Filed: Jan. 3, 1985

Related U.S. Application Data

[63] Continuation-in-part of Ser. No. 596,155, Apr. 2, 1984, abandoned.

[30] Foreign Application Priority Data

Jan. 21, 1984 [GB] United Kingdom ............... 8401625
Feb. 10, 1984 [GB] United Kingdom ............... 8403581
Apr. 26, 1984 [GB] United Kingdom ............... 8410670

[51] Int. Cl.⁴ ............................................. F25D 17/04
[52] U.S. Cl. ....................................... 62/417; 165/83
[58] Field of Search ................ 62/329, 383, 529, 530, 62/451, 466, 417, 531; 165/83

[56] References Cited

U.S. PATENT DOCUMENTS

| 2,444,887 | 7/1948 | Wyeth | 62/417 X |
| 2,449,101 | 9/1948 | Barley | 62/417 |
| 4,072,188 | 2/1978 | Wilson et al. | 165/83 X |

*Primary Examiner*—Lloyd L. King
*Attorney, Agent, or Firm*—Cushman, Darby & Cushman

[57] ABSTRACT

A cooling arrangement for electronic components mounted in racking systems in which access to the components is gained by moving a rack with reference to its supporting structure comprises a thin-walled cooling chamber of shallow depth carried by a fixed structure and arranged to be urged against and to conform with a wall of the rack, a pressurized liquid coolant being passed through the cooling chamber in the form of a lamina flow sheet to provide efficient cooling, the chamber being urged into its conformal position by an expandable chamber which is itself expanded by the pressurized coolant. Coolant is firstly used to expand the expandable chamber and then is ducted from that chamber into the cooling chamber from which it exits for subsequent recycling.

11 Claims, 18 Drawing Figures

HEAT TRANSFER ARRANGEMENT

This is a continuation-in-part (CIP) of application Ser. No. 596,155, filed Apr. 2, 1984, which was abandoned upon the filing hereof.

This invention relates to heat transfer arrangements where heat is to be transferred from one structure to another, one being detachable from the other or merely movable with reference to the other. Although having more general application, the invention has particular use in racking systems for electronic equipment in which the equipment within the units may generate excessive heat, so that cooling is necessary; efficient cooling is often inconsistent with such insertion or removal. For example, the use of fluid seals and couplings naturally militates against easy insertion and removal of the units.

British Pat. No. 1,517,650 discloses a method of cooling electronic devices comprising the steps of removably mounting the device or circuit adjacent a heat exchanger, said heat exchanger including a flexible wall partly defining a closed space in communication with a coolant inlet and outlet, the flexible wall being disposed in close proximity to said device or circuit, and supplying coolant to said space, the pressure of the coolant being in a range sufficient to cause the flexible wall to make a heat transfer contact with said device or circuit and also to permit coolant flow to continue during and after the removal of the device or circuit from the heat exchanger. In this disclosure, a flexible wall formed, for example, of thin copper sheet is bowed out under coolant pressure to contact a surface of a device to be cooled. Moreover, since the flexible wall merely bows to make heat transfer contact, there is difficulty in ensuring a sufficient contact area and a possible problem of fatigue in the periphery of the flexible wall.

British Patent Application No. 2,121,530A, which also relates to the cooling of electronic devices, discloses an urgable wall which is bodily moved into contact with the surface of a device to be cooled, the urgable wall being carried for bodily movement with respect to a fixed structure by means of a resilient diaphragm or bellows. It thus seeks to overcome these problems. However, in both these earlier arrangements, it is found that the heat transfer efficiency is far lower than expected. It is thus an object of the present invention to provide an improved arrangement which is both compact and has reasonable fluid flow rates and can cope with the high level of heat dissipation needed in advanced technology electronic systems whilst still having a reasonable first cost and low maintenance requirements.

According to one aspect of the present invention an arrangement for providing heat transfer between two relatively movable structures includes surface means on one structure and urgeable or movable chamber means on the other structure, the movable chamber means having first wall means which, in use, lies in heat transfer association with said surface means, second wall means in closely spaced relationship with the first wall means, means maintaining the spaced relationship between the two wall means, inlet and outlet means by which a fluid heat transfer medium can flow into and out of the movable chamber means, the arrangement being such that a thin flowing sheet of the heat transfer medium lies against the first wall means, and urging means urging said chamber means from a position in which its first wall means is spaced from said surface means to a position in which its first wall means is in heat transfer association with said surface means.

By this arrangement a generally lamina fluid flow is provided, together with a relatively high heat transfer efficiency.

The urging means may comprise an expandable chamber into which a pressured fluid is admitted Conveniently, when the heat transfer medium is suitably pressurized, it can be used to provide such expansion. Thus, when pressure is reduced or removed, the heat transfer association of the surface means and the first wall means is broken at least sufficiently to allow relative movement of the two structures without the necessity of disconnection or connection of ducts and the breaking or making of seals. This is particularly advantageous when the cooling medium is a liquid rather than a gas.

Conveniently, where the heat transfer medium is used also as the pressurizing medium, then the expanding and movable chambers are in flow communication.

In a racking system of the type to which reference is made above, the chambers are formed in the fixed rack structure whilst the surface means to be in heat transfer association wth the urgable chamber is formed on a drawer unit. In a further arrangement, the chambers are formed in a lid or door adapted to swing from an open to a closed position with respect to a fixed structure on which the surface means to be in heat transfer association is formed or carried.

Preferably, the means to maintain the spaced relationship between the two wall means of the movable chamber comprises a series of dimples formed on the second wall means of that chamber.

Other aspects of the invention are disclosed in embodiments of the invention now described by way of example with reference to tne accompanying drawings in which.

Figure 1:
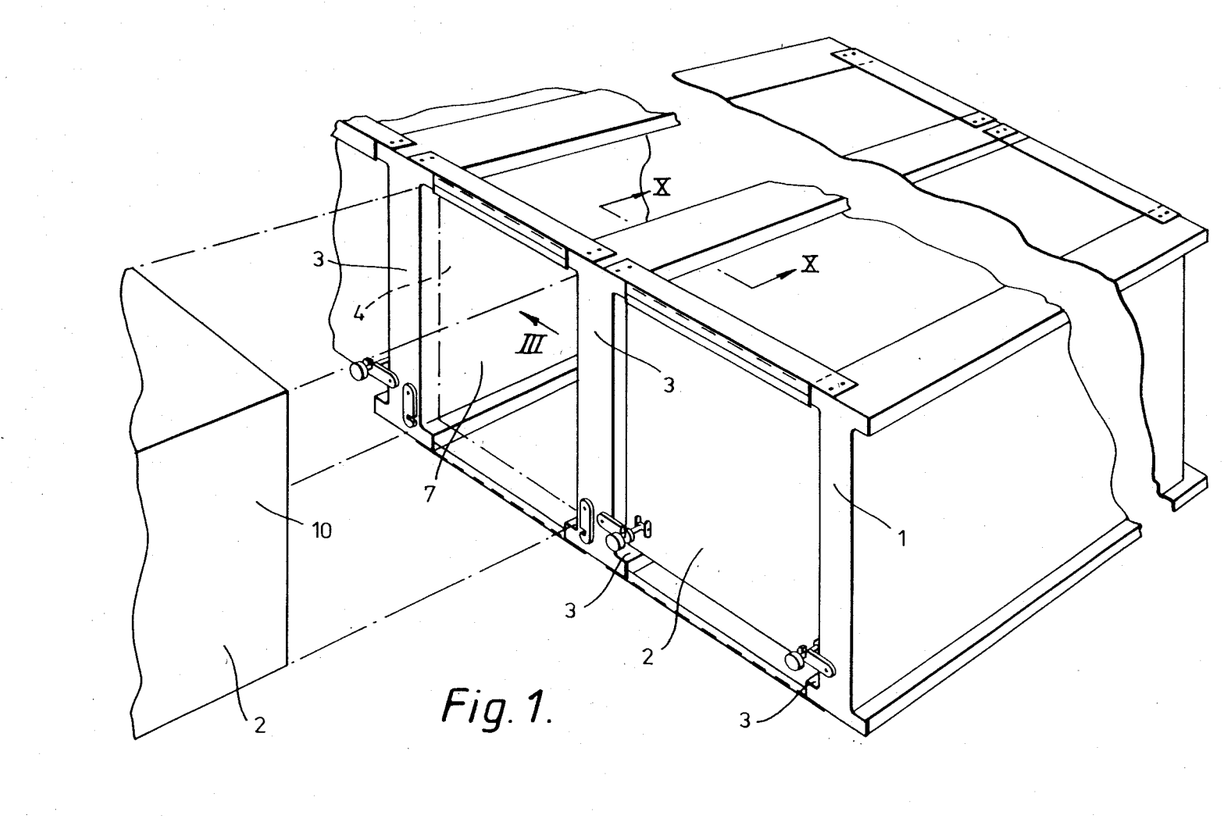
FIG. 1 is a perspective view of a racking system for electronic components.

A racking system for electronic equipment shown in FIG. 1, includes a rack structure 1 and a plurality of drawer units 2 slidable into and out of the rack structure before and after use. The units 2 slide on guides; they require in this instance to be cooled. Formed within each upright region 3, 3a of the rack structure is an movable chamber 4 through which pressurized coolant, e.g. a water, is circulated. Walls 10 of a drawer unit 2 require to be cooled and the chambers are thus urged into heat transfer contact with those walls.

Figure 2:
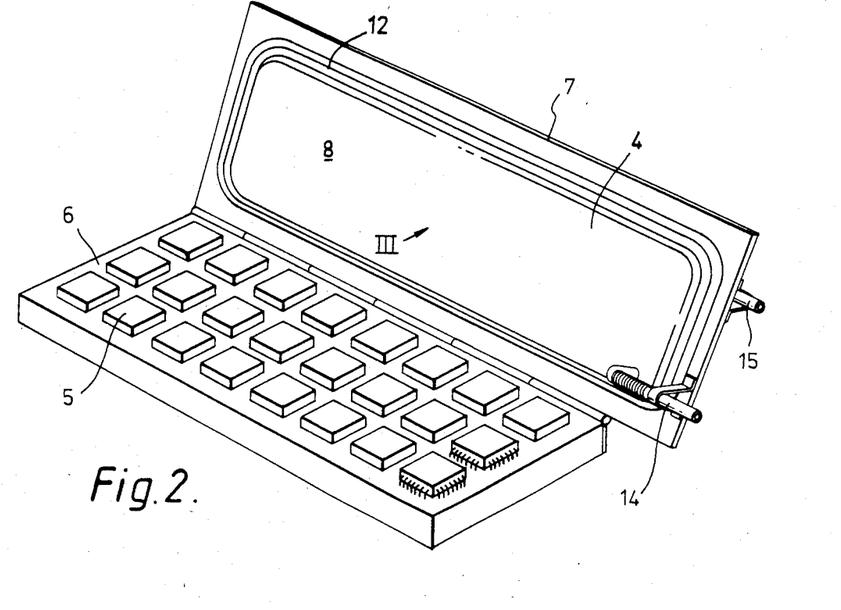
FIG. 2 is a perspective view of an alternative housing system for electronic components.
Figure 3:
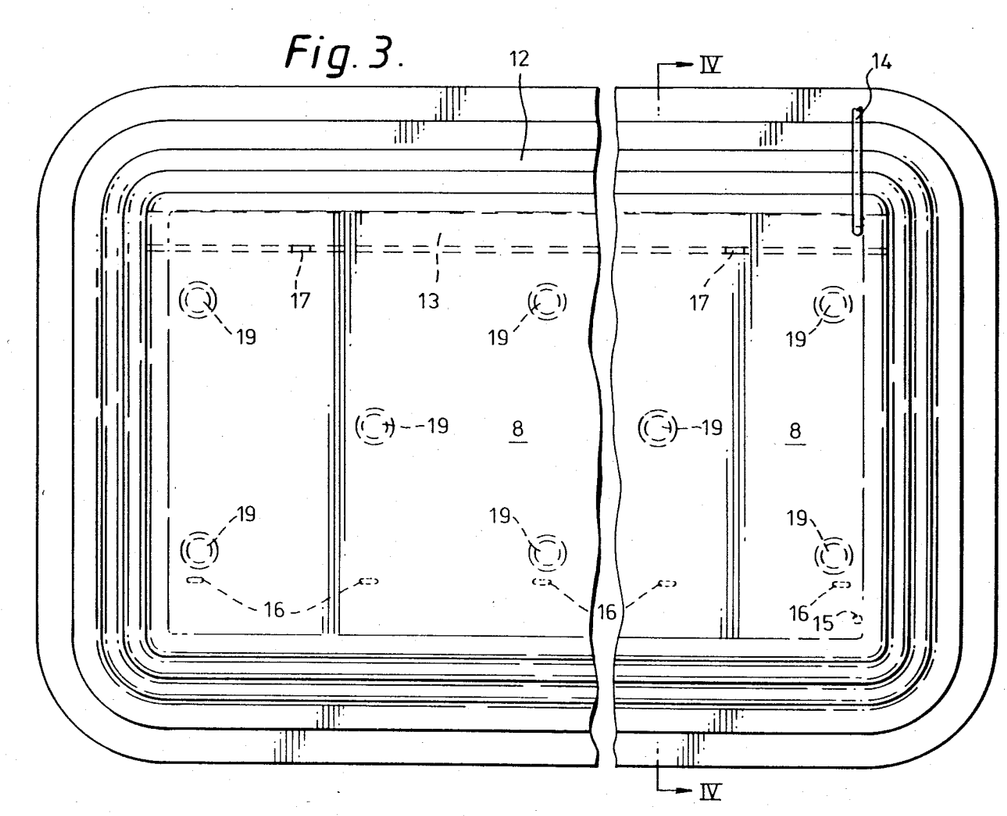
FIG. 3 is a plan view of an movable chamber, that is to say a view on Arrow III of FIGS. 1 and 2.

In FIG. 2, a group of leadless chip carriers 5 are mounted on a base 6 with their faces to be cooled lying in generally planar relationship. Hinged to the base 6 is a cover 7 having, on an inner face, a similar chamber 4 which in use will be urged against the faces of the chip carriers 5 for cooling purposes.

Each movable chamber 4 has an outer wall 8 which faces a wall 10 of an inserted drawer unit or the faces of the leadless chip carriers shown in FIG. 2. That embodiment of FIGS. 10 and 11 has two oppositely facing chambers 4, being in an intermediate upright region 3, whilst end upright regions, such as that illustrated at 3a, have only a single chamber 4. The arrangement of FIG. 2 has a single such chamber being part of a lid or door. For ease of description FIGS. 3–9 illustrate a single chamber arrangement, although the essential features are similar.

Referring particularly to FIGS. 3–9, each urgable chamber 4 further has an inner wall 9 spaced from, but closely adjacent, the wall 8. Each wall is formed of a plate of suitably thin heat conducting material, e.g. stainless steel foil of between 0.1 mm and 0.2 mm, say 0.15 mm thickness, selected to accommodate any unevenness in the wall 10 or the faces of the chip carriers.

Figures 4, 5:
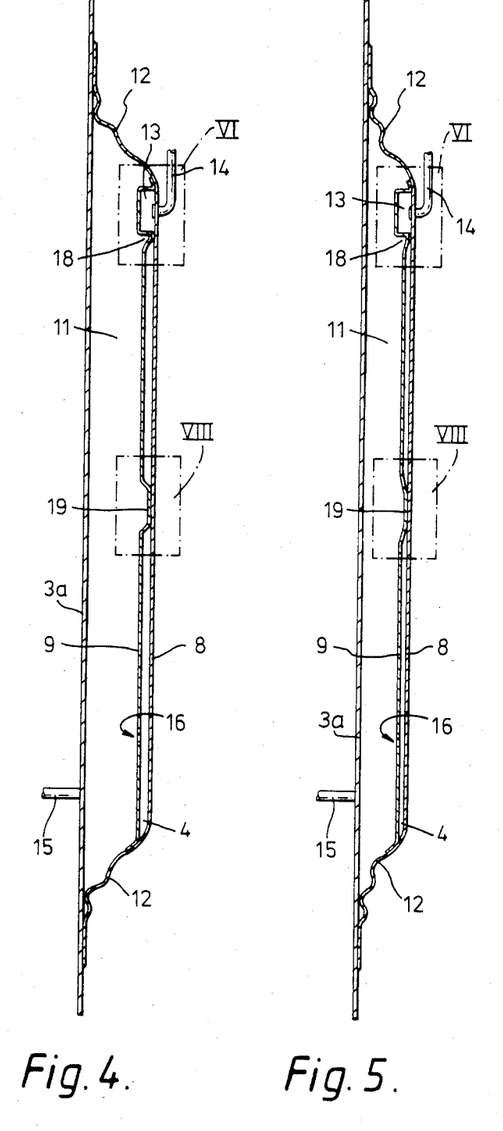
-FIG. 4 is a sectional view upon line IV—IV of FIG. 3 in an expanded condition.
FIG. 5 is a similar view to that of FIG. 4 in a relaxed condition.
Figure 11:
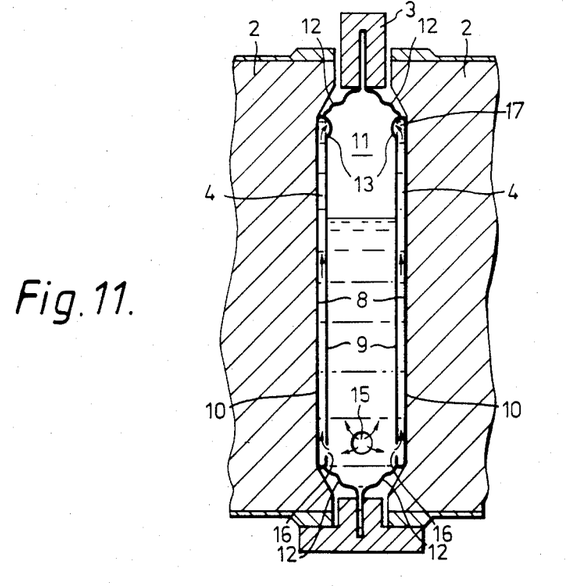

Each chamber is urged to the position of FIGS. 4 and 11 in which its wall 8 is in heat transfer association with the wall 10 or the faces of the chip carriers by means of coolant pressure. To achieve this, a further chamber 11 is provided. The further chamber 11 is bounded by resilient bellows or diaphragm regions 12. The regions 12 are formed of a similar material to the walls 8 and 9 and may conviently be integral with the outer wall 8.

Figure 10:
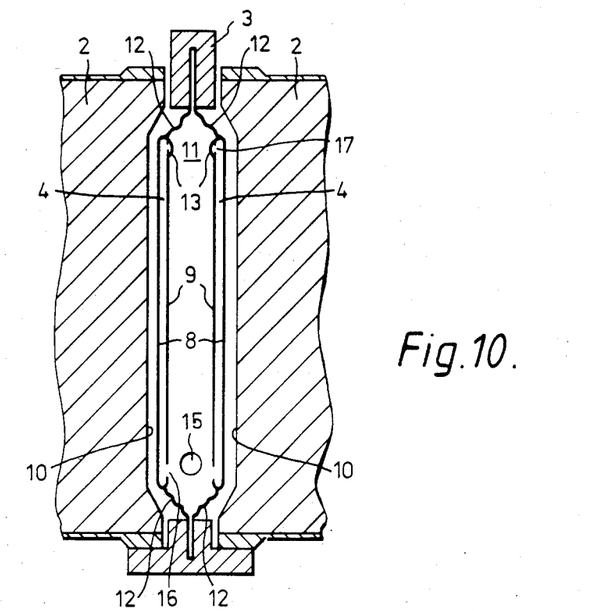

The periphery of the regions 12 is welded to a plate region of the upright 3a or the cover 7 or, alternatively, to the periphery of a further region 12 after the manner illustrated in FIGS. 10 and 11 to provide a fluid sealed chamber.

The inner wall 9 is welded around its periphery to the outer wall 8 to form the chamber 4. It thus separates the chamber 4 from the chamber 11. Conveniently an elongate coolant outlet duct 13 extending substantially the full length of the chamber 4 is formed by an extended portion of the wall 9. This is in flow communication with an outlet pipe 14 (not shown in FIGS. 10 and 11).

An inlet pipe 15 is provided to feed pressurised coolant into the chamber 11 and thus expand that chamber from the position of FIGS. 5 and 10 to the position of FIGS. 4 and 11.

Figure 6:
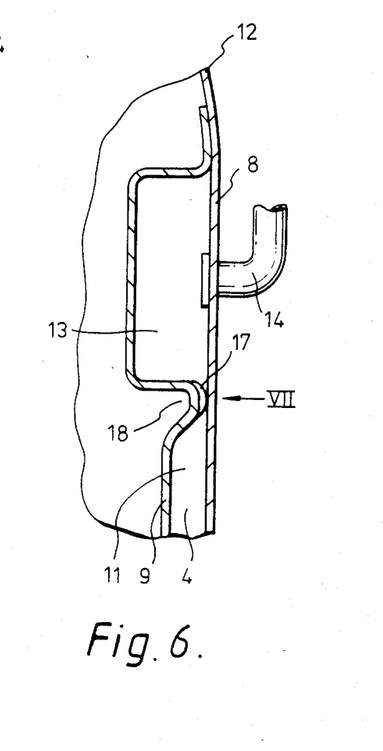
FIG. 6 is an enlarged detail view of the region in Box VI of FIGS. 4 and 5.
Figure 7:
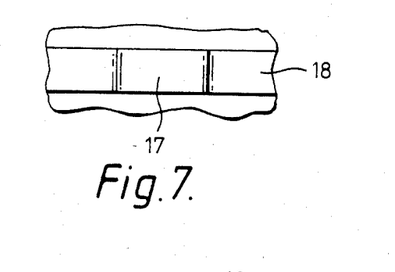
FIG. 7 is a detailed view on Arrow VII of FIG. 6 with an outer wall removed.
Figure 8:
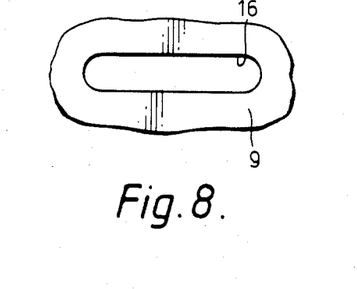
FIG. 8 is an enlarged detail view of the region in Box VIII of FIGS. 4 and 5.
Figure 9:
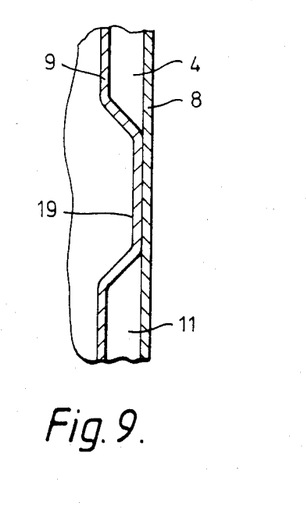
FIG. 9 is an enlarged detail view of the apertured region in Box IX of FIG. 3, FIGS. 10 and 11 are respectively diagrammatic cross-sectional views in the plane of line X—X of FIG. 1 in a relaxed and an expanded condition.

A series of apertures 16 in the form of slots disposed near an opposite edge of the chamber 4 to the outlet duct 13 are formed in that wall 9 which separates the chamber 4 from the chamber 11. These slots are shown in FIG. 9. A further series of slotted apertures 17 is formed between the chamber 4 and the outlet duct 13. Conveniently these are formed in the welded periphery of the wall 9 where it is continued at 18 to form the duct 13 as shown in FIGS. 6 and 7.

Since the walls 8, 9 are of a relatively thin material, they may move towards one another under the urging of the pressurized coolant. Therefore, means are provided to prevent this, that is to maintain two walls of the chamber 4 substantially at a desired spacing. FIGS. 3, 4, 5 and 8 illustrate one way of achieving this by providing each inner wall 9 with dimpled regions 19. This arrangement allows the outer wall 8 to adapt to the contour of the adjacent wall 10 or chip carrier without being stiffened by its inner wall 9. Moreover, coolant flow is not materially affected.

In operation, the pressurised coolant fluid is introduced through the inlet pipe 15 to at least substantially fill and expand the chamber 11 and thus effect outward bodily urging of the chamber or chambers 4 until they are in heat transfer association with the surfaces to be cooled. Coolant flows through the series of apertures 16 into the chamber 4 and forms a thin sheet of coolant which flows over the inner surface of the wall 8 until it exits into the outlet duct 13 via the series of slotted apertures 17. It then passes into outlet duct 13 and then into the outlet pipe 14 without re-entering the body the coolant in the chamber 11. After cooling, the coolant is recirculated in known manner.

By way of example, one embodiment of the invention has the following characteristics:

Cooling contact area: 450 mm × 150 mm
Cooling depth (i.e. distance between walls 8 and 9): 1.5 mm
Inlet slots (i.e. items 16): 1 mm × 5 mm (10 in number)
Outlet slots (i.e. items 17): 0.5 mm × 5 mm (10 in number)
Outlet duct cross section (i.e. item 13): 5 mm × 10 mm With a water coolant, a mass flow of 16 grams/second at a pressure of 14 KN/m$^2$ (2 PSI) was found to provide substantially lamina flow in the chamber 4 (a Reynolds Number of 106.5) and gave a 5 mm movement of the chamber 4 between the relaxed and the expanded states of the chamber 11. The coolant removed about 200 watts of energy with a temperature of between 2° and 3° Centrigrade. --

The lamina flow of the sheet of coolant within the chamber 4 is, in practice, essential to achieve the desired high heat transfer efficiency.

In the further embodiment illustrated in FIGS. 12 to 18, the various components are formed of copper or beryllium copper for improved heat transfer ability. Moreover, the wall 8 is provided with means to increase the surface area contacted by the coolant in the urgable chamber 4 and thus further improve the heat transfer ability of the arrangement. In this embodiment, said means comprise a series of parallel channels 30 extending between the inlet 34 and outlet 35 regions of the chamber 4, but other arrangements, such as fins or pins, could be used.

The channels 30 are conveniently formed by corrugated copper sheet members 31 soldered at their peaks 32 to the wall 8, so as to be in intimate heat transfer relationship therewith.

The length of the channels 30, that is to say the width of each copper sheet member 31 is much less than the distance between the regions of the inlet 34 and outlets 35 to the chamber 4. Thus a plurality of such members 31 are positioned side-by-side with their channels 30 generally parallel within the chamber 4. This arrangement allows the wall 8 to remain reasonably flexible across the length of the channels 30 which would otherwise act to excessively stiffen it.

Figure 17:
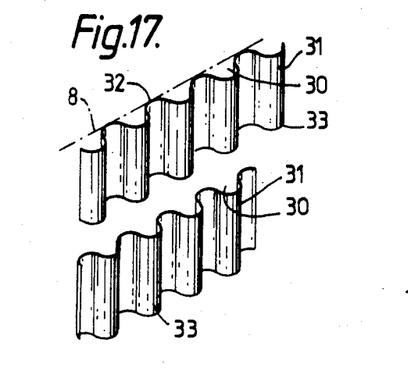
FIG. 17 is a perspective view of the corrugated members attached to the urgable wall of the present invention.

As is shown in FIG. 17, in which the wall 9 is omitted for clarity, the channels 30 of adjacent corrugated members 31 are not in register; thus the flow of an element of coolant through an individual channel 30 is split as it enters a successive channel 30.

Conveniently, one trough 33 in every ten of the corrugations or channels is at least partially along its length soldered to the wall 9.

Figure 12:
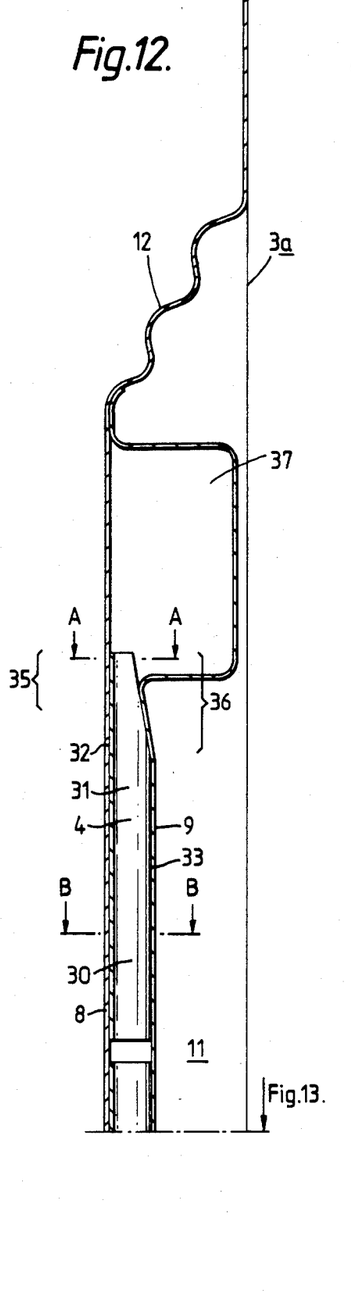
FIGS. 12 and 13 are upper and lower sectional views and elevation, respectively, of another embodiment of the chamber wall of the present invention.
Figure 13:
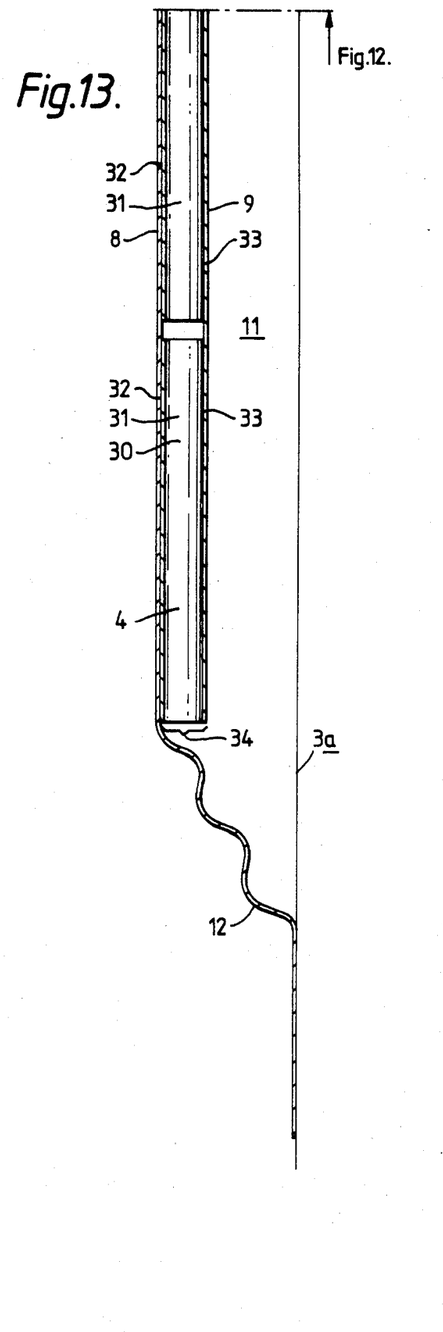
Figure 14:
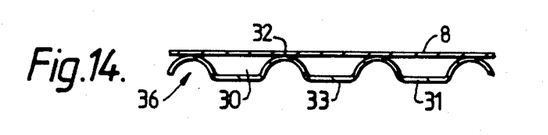
FIG. 14 is a perspective view along lines A—A of FIG. 12.
Figure 15:
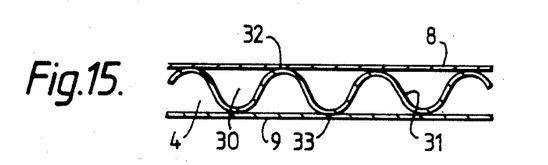
FIG. 15 is a prespective view along lines B—B of FIG. 12.
Figure 16:
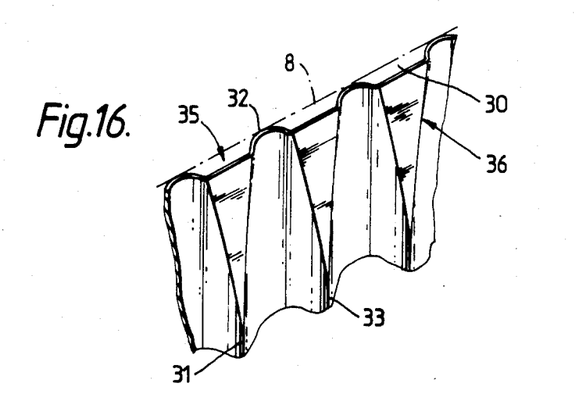
FIG. 16 is a prespective view of the upper end portions of the chamber wall of the present invention.

As is shown in FIGS. 12, 14 and 16, conveniently the depth of each trough 33 in the vicinity of the outlet 35 is gradually reduced towards the outlet. Reference 36 denotes this reduction in depth.

In the embodiment of FIGS. 12-18, the inlet region 34 to the chamber 4 is formed by terminating the wall 9 short of the wall 8, the spacing of these walls being maintained by the presence of the corrugated members 31. Similarly, the outlet region 35 from the chamber to an outlet duct 37 (similar to the duct 13 of earlier Figures) is provided by deformation of the wall 9 and by the gradually reducing depth of the corrugations at 36.

Figure 18:
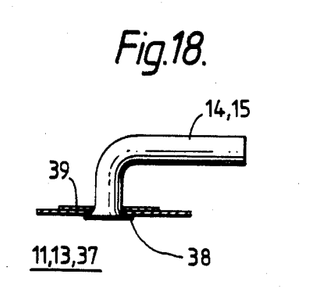
FIG. 18 is an enlarged detailed view of the inlet-outlet tube 14–15 of the present invention.

In FIG. 18, the inlet and outlet tubes 15 and 14 respectively are similar and are illustrated. They communicate with the interiors respectively of the chamber 11 and the duct 13/37.

The tubes are of copper, belled at 38 to locate in said interiors and reinforced by an exterior washer 39. The whole is soldered together.

Suitable dimensions for the embodiment of FIGS. 12-18 are as follows:

Depth of corrugations (channels 30) at outlet 35=1.2 mm.
Depth of corrugations (channels 30) elsewhere=2.5 mm.
Width of corrugated sheet members 31=20.0 mm.
Gap between adjacent sheet members 31=1.0 mm.
Outlet and Inlet pipes, 14 and 15, Diameter=8.0 mm.
Width of outlet duct 37=12.0 mm.
Depth of outlet duct 37=7.0 mm.
Thickness of copper sheet components generally=0.1 mm.
Distance between crests 32 of corrugations=5.0 mm.

We claim:

1. A cooling arrangement for electronic components mounted in a structure in which access to the components is gained by moving one part of the structure with reference to another, for example in a racking system, the cooling arrangement being adapted to allow such access without disassembly, including surface means on one part of the structure and movable chamber means on the other part, the movable chamber means having wall means which, in use, lie in heat transfer association with said surface means, second wall means in closely spaced relationship with said first wall means, inlet and outlet means by which a fluid heat transfer medium can flow into and out of the movable chamber means, the disposition of the two wall means being such that a flowing sheet of the heat transfer medium lies against the first wall means in use, and urging means urging said chamber means from a position in which its first wall means are spaced from said surface means to the position in which its first wall means are in heat transfer association with said surface means, said urging means comprising chamber means having inlet means through which heat transfer medium is admitted to effect expansion of said expandable chamber means, flow connection means connecting the inlet means to said movable chamber means, through which the heat transfer medium can flow from the expandable chamber means into the movable chamber means, and outlet means for directing heat transfer medium flow from said movable chamber means without mixing flow in the expandable chamber means.

2. An arrangement according to claim 1, wherein the means maintaining the spaced relationship between the two wall means comprises a series of dimples formed upon the second wall means.

3. An arrangement according to claim 1, wherein the flow connection means and the outlet means each include a series of slotted apertures formed in end-to-end relationship.

4. An arrangement according to claim 3, wherein said means to direct heat transfer medium flow from the movable chamber comprises a duct in which the series of slotted outlet apertures are formed.

5. An arrangement according to claim 4, suitable for use with a liquid cooling medium, wherein the movable chamber means is about 450 mm×150 mm in cooling contact area, the distance between the first wall means and the second wall means is about 1.5 mm, the slotted apertures forming the flow connection means. are 10 in number and are about 1 mm×5 mm, the slotted apertures forming the flow outlet means are 10 in number and are about 0.5 mm×5 mm, and the outlet duct is about 50 mm² in cross sectional area.

6. A cooling arrangement according to claim 1, wherein both the first and second wall means are formed of metallic foil.

7. An arrangement according to claim 1 wherein channeled heat transfer means having alternate peaks and troughs are provided within the movable chamber, the channels extending between the inlet and outlet means so as not to significantly impede the flow of the coolant sheet, and means anchoring the peaks thereof in intimate heat transfer relationship with said first wall means.

8. An arrangement according to claim 7 wherein the channelled heat transfer means is in at least tow portions arranged with their channels in tandem and with a spacing between adjacent channel ends such that said first wall is not excessively stiffened.

9. An arrangement according to claim 8 wherein said portions of the channelled heat transfer means have the channels staggered with reference to one another.

10. An arrangement according to claim 7 in which the inlet and outlet means are formed by entrance and exit regions of the channels.

11. An arrangement according to claim 10 in which the troughs of the channels are deformed to provide outlet means of smaller area than the inlet means.

* * * * *